(12) United States Patent
Tanimoto

(10) Patent No.: US 6,704,088 B2
(45) Date of Patent: Mar. 9, 2004

(54) ENVIRONMENTAL-CONTROL METHOD AND APPARATUS FOR AN EXPOSURE SYSTEM

(75) Inventor: Akikazu Tanimoto, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/323,742

(22) Filed: Dec. 20, 2002

(65) Prior Publication Data

US 2003/0164929 A1 Sep. 4, 2003

Related U.S. Application Data

(63) Continuation of application No. 09/604,259, filed on Jun. 27, 2000, now abandoned, which is a continuation of application No. 08/797,519, filed on Feb. 7, 1997, now abandoned.

(30) Foreign Application Priority Data

Feb. 9, 1996 (JP) .............................................. 8-047942

(51) Int. Cl.⁷ .......................... G03B 27/52; G03B 27/42
(52) U.S. Cl. .......................... 355/30; 355/53; 359/507; 454/187
(58) Field of Search ..................... 355/30, 53; 359/507, 359/509, 512; 378/34, 35; 430/30; 73/23, 2; 454/187

(56) References Cited

U.S. PATENT DOCUMENTS

| | | |
|---|---|---|
| 4,690,528 A | 9/1987 | Tanimoto et al. |
| 4,704,348 A | 11/1987 | Koizumi et al. |
| 4,786,947 A | 11/1988 | Kosugi et al. |
| 4,852,133 A | 7/1989 | Ikeda et al. |
| 5,353,323 A | 10/1994 | Hirokawa et al. |
| 5,430,303 A | 7/1995 | Matsumoto et al. |
| 5,550,633 A | 8/1996 | Kamiya |
| 5,559,584 A | 9/1996 | Miyaji et al. |
| 5,602,683 A | 2/1997 | Straaijer et al. |
| 5,696,623 A | 12/1997 | Fujie et al. |
| 5,871,587 A | 2/1999 | Hasegawa et al. |
| 5,892,572 A | 4/1999 | Nishi |

FOREIGN PATENT DOCUMENTS

| | | |
|---|---|---|
| JP | 1-181518 A | 7/1989 |
| JP | 6-216000 | 8/1994 |

*Primary Examiner*—Alan Mathews

(57) ABSTRACT

A specified gas is supplied into a chamber where masks or reticles to be exposed are arranged. Part of the air-gas mixture within the chamber is exhausted into the atmosphere. After that, when the gas within the chamber reaches a specified concentration, part of the air-gas mixture within the chamber is circulated and an appropriate concentration of gas is supplied to the chamber.

50 Claims, 4 Drawing Sheets

ENVIRONMENTAL-CONTROL METHOD AND APPARATUS FOR AN EXPOSURE SYSTEM

This application is a continuation of application Ser. No. 09/604,259, filed Jun. 27, 2000, now abandoned, which is continuation of Ser. No. 08/797,519, filed Feb. 7, 1997, now abandoned.

BACKGROUND OF THE INVENTION

This invention relates to an environmental-control method for an exposure apparatus and an apparatus which actualizes the goal. Specifically, it relates to the filling method and equipment for filling an inert gas of a specified concentration into a chamber in which a reticle is positioned for an exposure procedure.

As the semiconductor IC becomes more and more integrated, an excimer laser is under consideration for use as an exposure light source for an exposure apparatus in the lithographic process in semiconductor manufacturing. For example, a light source being considered for an exposure apparatus for manufacturing chips of 64 MB DRAM to 256 MB DRAM is a KrF excimer laser of 248 nm wavelength. In addition, in manufacturing chips of higher integration, such as 1 GB DRAM, the use in an exposure apparatus of an ArF excimer laser of 192 nm wavelength is being considered. In an exposure apparatus using the ArF excimer laser and the like as its light source, any portion containing oxygen which absorbs light will have to be purged with an inert gas such as nitrogen or helium which will consequently let the light go through such portion.

In an exposure apparatus, it is necessary to chuck a mask on which a specified circuitry pattern is formed as well as to transfer the mask between the so-called "library," mask storage, and a mask stage chamber where the mask is exposed to light. In general, masks are taken to and from the outside of the apparatus through the library. Therefore, it is difficult to isolate the mask stage chamber from the outside. In addition, the mask stage chamber occupies a large volume.

Therefore, replacing air in the mask stage chamber with an inert gas takes a long time. The exposure system of the so-called "step and scan" technique which synchronizes the mask scanning with the substrate movement has a particularly large mask stage chamber. Therefore, replacing air with an inert gas takes an especially long time and requires a large quantity of inert gas. Increasing the amount of an inert gas supplied per unit of time, that is, increasing supply pressure, may reduce the time required for supplying an inert gas to the mask stage chamber. However, there is a limit to increasing supply pressure for an inert gas supplied to the mask stage chamber.

In other words, in general, an exposure apparatus is arranged with a lens system, such as a condenser lens, on top of the mask stage chamber and with projection lenses at the bottom. Therefore, supplying a highly pressurized inert gas into the mask stage chamber pressurizes these peripheral lenses, causing distortion of optical components, thus introducing other problems.

SUMMARY OF THE INVENTION

It is accordingly an object of the present invention to solve the aforementioned problems and to provide a method and apparatus which efficiently fills a specified gas into a chamber where a mask or reticle is positioned.

Another object of this invention is to provide an environmental-control apparatus which improves safety during the operation of an exposure apparatus.

To resolve the aforementioned problems in the method incorporating the principles of this invention, a specified gas is supplied to a chamber in which a mask to be exposed is arranged. Part of the air-gas mixture that exists in the chamber is exhausted. After the gas within the chamber reaches a specified concentration, a part of the air-gas mixture is circulated back into the chamber to fill it in with a gas of an appropriate concentration.

The apparatus incorporating the principles of this invention comprises a gas-supplying means which supplies a specified gas to the chamber; an exhaust means which exhausts a part of the air-gas mixture within the chamber and the gas; a detection means which detects the concentration of the gas within the chamber; and a circulation-control means which circulates a part of the mixture within the chamber when the gas within the chamber reaches a specified concentration as determined by the detection means.

In a preferred embodiment, the apparatus comprises mask storage which stores masks to be exchanged with the aforementioned mask;

a mask-transfer chamber which is formed between the mask storage and a mask stage chamber; and a pressure-control means which sets parameters to satisfy the relationship among (A), the pressure within the mask stage chamber; (B), the pressure of the mask storage; (C), the pressure of the mask-transfer chamber; and (D), the pressure outside the apparatus by fulfilling the following two equations, (1) and (2):

$$A \geq B > C \tag{1}$$

$$A \geq B > D \tag{2}$$

An embodiment of the exposure apparatus may further comprise a sealing means for sealing any space between the mask stage chamber and the transfer chamber when a mask is not passing between them.

The aforementioned circulation-control means may comprise, for example:

a duct for guiding the air-gas mixture within the chamber to the gas-supply means, a mixing means for re-mixing the air-gas mixture supplied through the duct with the gas, and a passage-control means for controlling the flow of the mixture supplied via the duct, wherein the passage-control means guides the mixture supplied via the duct to the air-gas mixing means when the gas within the chamber reaches a specified concentration.

The mixing means may be constructed such that it also acts, for example, as a blowing means which sends a re-mixed gas into the mask stage chamber. Also, the gas-supply means can comprise a blowing means which aids in supplying the gas to the mixing portion, and the passage-control means may comprise a blowing means connected to the duct, and a selection portion which allows the mixture from the blowing means to be selectively supplied to the mixing portion.

An embodiment of the apparatus may also comprise an ionizing means for ionizing at least a part of the gas supplied from the gas-supply means. It also may comprise a steam-supply means for mixing steam with the gas supplied from the gas-supply means.

As described above, in the method and apparatus incorporating the principles of the present invention, because a part of the mixture of a specified gas and the air within the chamber is returned to the chamber and circulated therein, most of the gas supplied to the chamber is recycled, thus reducing the amount of gas supplied. In addition, the mixture begins to circulate at the point when the gas in the chamber reaches a specified concentration, thus, reducing the time required for replacing the air in the chamber with a gas.

Also, because the relationships among the pressures within the mask stage chamber, within a storage area in a mask-transfer chamber, and outside of the apparatus are set as aforementioned, the gas in the mask stage chamber does not flow into the transfer chamber even when a mask is moved into or out of the chamber. Therefore, the purity of the gas in the chamber does not deteriorate, increasing the gas-supply efficiency. In addition, because the gas does not enter the mask-storage area, there is no danger of it being discharged from the storage area.

BRIEF DESCRIPTION OF THE DRAWINGS

The above and other objects, features, and advantages of the present invention will become more apparent from the following detailed description taken with the accompanying drawings, in which.

DESCRIPTION OF THE PREFERRED EMBODIMENTS

Figure 1:
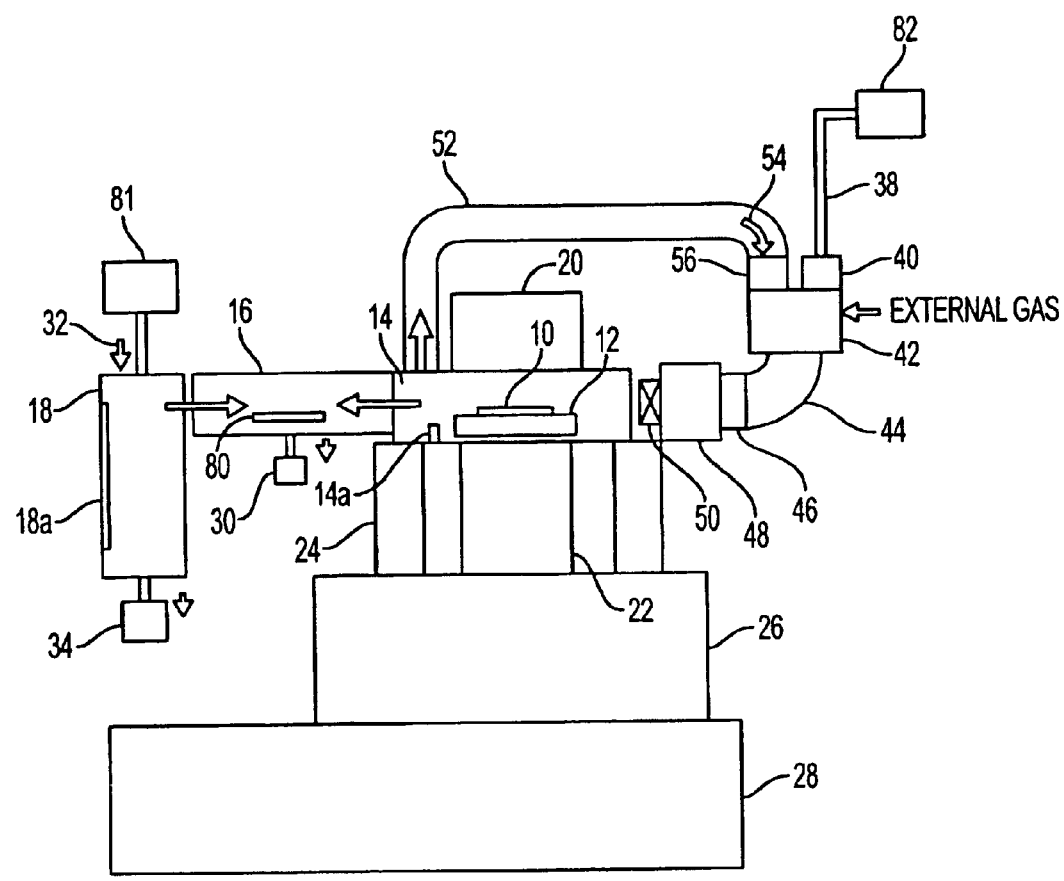
FIG. 1 is a schematic configuration of a projector-exposure apparatus according to a first embodiment of the present invention.

Referring to the drawings, FIG. 1 illustrates a schematic configuration of a projector-exposure apparatus to which the first embodiment of this invention is applied. In the Description of the Preferred Embodiments the term "reticle" may be used. It is to be appreciated that the reticle may be part of a mask and therefore the terms "mask" and "reticle" may be used interchangeably for the purposes of this description. In FIG. 1, a reticle 10 on which a specific circuit pattern is formed is loaded on a reticle stage 12 in a mask or reticle-stage chamber 14. The reticle-stage chamber 14 is connected with a reticle-library chamber 18 via a reticle-transfer chamber 16. Above the reticle 10 is arranged a lighting portion 20 which irradiates deep ultraviolet (DUV) as the exposure light. Under the reticle 10 is arranged a projection lens system 22.

The reticle-stage chamber 14 is supported by a column 24. Under the column 24 is arranged a wafer stage (not illustrated) and its peripheral air-conditioning structure and a wafer-stage portion 26 including a structure which supports the upper structure. The wafer-stage portion is arranged on a base portion 28 including an anti-vibration base. In the reticle-stage chamber 14, an oxygen-concentration sensor 14a is arranged which detects the internal oxygen concentration in the chamber on the left or the downstream side of the reticle stage 12.

A plurality of reticles stored in the reticle-library chamber 18 are picked up one by one and are transferred to the inside of the reticle-stage chamber 14 by means of a reticle-transfer system 80 via the reticle-transfer chamber 16. When returning the reticle 10 to the reticle-library chamber 18, the routing is reversed. An opening for passing the reticle is formed between the reticle-library chamber 18 and the reticle-transfer chamber 16, and the space between the reticle-transfer chamber 16 and the reticle-stage chamber 14. An exhaust duct is formed on the reticle-transfer chamber 16 for continually exhausting a predetermined amount of the air from the reticle-transfer chamber 16 to the outside of the apparatus by an exhaust system 30.

In the reticle-library chamber 18, an open/close door 18a for moving reticles into or out of the apparatus allows air to flow in or out between the apparatus and the area external to the apparatus. Clean air is taken into the reticle-library chamber 18 via an air-conditioning system 81 and a part of the air is exhausted by an exhaust system 34.

Next, the configuration that allows air in the reticle-stage chamber 14 to be purged with an inert gas is described following the gas flow. An inert gas such as nitrogen or helium, which does not absorb exposed DUV light, is supplied from a gas-supply source 82 via an external gas-supply line 38. The gas-supply source 82 is outside the apparatus. The gas passes through a valve 40, and then is sent to a thermal exchanger 46 via a duct 44 with the assistance of a blower 42. The thermal exchanger 46 adjusts the temperature of the supplied inert gas, slowing down the flow rate with the assistance of a baffle 48. The inert gas is then supplied to a ULPA filter 50. The ULPA filter 50 filters particles that exist in the gas. After passing through the ULPA filter 50, the gas is sent to the reticle-stage chamber 14. The valve 40 is configured in such a way that the valve can open/close with respect to the external plumbing 38 and the air outside the apparatus so that it can select either open or closed status to send the gas to the blower 42. The valve 40 is normally open with respect to the external plumbing 38 and closed with respect to the air outside the apparatus.

The gas supplied to the inside of the reticle-stage chamber 14 through the ULPA filter 50 is designed to be pumped out from the reticle-stage chamber 14 through two possible routes. The first route uses a return duct 52, while the second route goes through the opening which leads to the reticle-transfer chamber 16, as indicated by the arrow 53. The return duct 52 is shown arranged on top of the reticle-stage chamber 14 in FIG. 1 for illustrative purposes, but it is arranged underneath in reality. The gas which passes through the return duct 52 returns to the blower 42 via a controllable variable damper 56, as indicated by an arrow 54, and then is mixed with fresh gas taken in from the external plumbing 38 to be sent to the reticle-stage chamber 14 along the same route as before.

When the exposure apparatus is being installed or serviced, the reticle-stage chamber 14 has air in it. The air has to be purged with an inert gas. For this purpose, the variable damper 56 should be kept closed until the gas in the chamber 14 reaches a specified purity. When monitoring the gas purity, a control system 60, to be described herein, judges that the gas has reached a specified purity, for example, by the fact that the oxygen concentration sensor 14a detects oxygen below a specified value. With this technique, not only can the gas consumption during inert gas purging be reduced, but also the time required for purging can be reduced.

Determinations must be made for the pressure at which the gas is pumped in through the ULPA filter 50, the pressure at which the clean air 32 is supplied to the reticle-library chamber 18, and the pressure at which the exhaust systems 30 and 34 are pumped out. If the pressure within the reticle-stage chamber 14 is A, the pressure within the reticle-library chamber 18 is B, the pressure within the reticle-transfer chamber 16 is C, and the pressure outside the apparatus is D, then the following relationships (1) and (2) have to exist:

$$A \geq B > C \qquad (1)$$

$$A \geq B > D \qquad (2)$$

With these parameters, the gas containing air (e.g., oxygen) does not enter the reticle-stage chamber 14 from the reticle-transfer chamber 16 and also an inert gas does not enter the reticle-library chamber 18. For this reason, even if an operator opens the door 18a of the reticle-library chamber 18 and inhales air from inside the chamber, he will not be affected by the gas. In addition, the positive pressure maintained in the reticle-library chamber 18 with respect to the outside of the apparatus prevents particles migrating in with air from the area outside the apparatus. A mixture of an inert gas and air is exhausted through the exhaust system 30 and is pumped out to outside the clean room.

In the inverse situation from the above, when purging an inert gas in the reticle-stage chamber 14 with air, the valve 40 should be closed with respect to the external plumbing 38 and be opened with respect to the area outside of the apparatus to take air into the blower 42 from outside. With this operation, the reticle-stage chamber 14 is quickly purged with air. Purging inside the reticle-stage chamber 14 is done basically to ensure safety for operators when operators come close to the reticle-stage chamber 14. If the oxygen concentration sensor in the reticle-stage chamber 14 is monitored, better safety can be assured.

Figure 2:
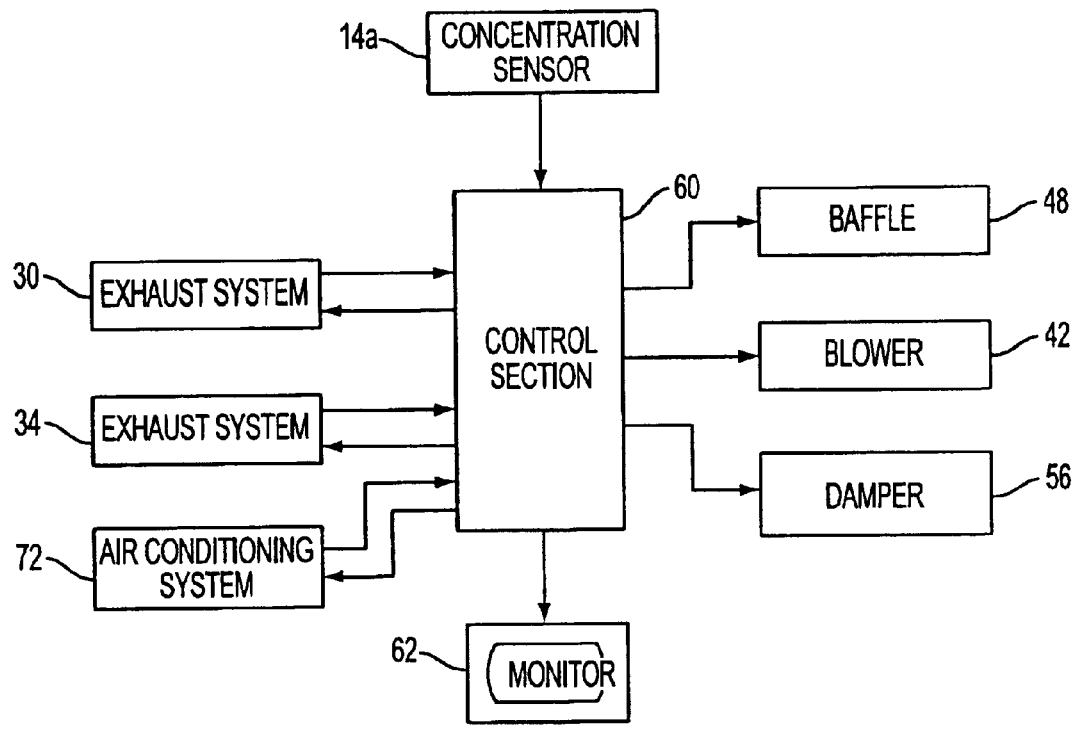
FIG. 2 is a block diagram illustrating the control system of the apparatus of FIG. 1.

FIG. 2 illustrates the configuration for the control system of this embodiment. The projector-exposure apparatus is centrally controlled by a control section 60. The aforementioned oxygen concentration sensor 14a, exhaust systems 30 and 34, baffle 48, blower 42, damper 56, an air-conditioning system 72, and a monitor 62 are connected to the control section 60. With this configuration, the control section 60 controls the exhaust systems 30 and 34, baffle 48, blower 42, and damper 56 such that the pressure A in the reticle-stage chamber 14, the pressure B in the reticle-library chamber 18, the pressure C in the reticle-transfer chamber 16, and the pressure D outside the apparatus maintain the aforementioned relationships (1) and (2). For example, if the exhaust system 30 stops operating when an accident or the like occurs, the control section 60 closes valve 40 to stop supplying gas. With this operation, the danger for emitting gas outside the apparatus is eliminated, consequently improving the safety for the apparatus.

In order to purge the air mixed status of the reticle-stage chamber 14 with an inert gas, when the oxygen concentration sensor 14a detects that the oxygen concentration is below a specified value, the control section 60 controls the variable damper 56 to circulate the gas in the reticle-stage chamber 14. In other words, the control section 60 opens the variable damper 56 with respect to the return duct 52 to mix the highly concentrated gas supplied via the valve 40 with the gas which has already passed through the reticle-stage chamber 14. With this type of control, an efficient purging of the reticle-stage chamber 14 with an inert gas is provided.

Note that an appropriate value for the base oxygen concentration is set to determine the timing for starting circulating gas in the reticle-stage chamber 14 based on the capacity (i.e., volume) of the reticle-stage chamber 14 and the return duct 52, the gas flow rate per unit of time at which a gas is supplied to the reticle-stage chamber 14 and the like. For example, the time for starting the gas circulation may be when the oxygen concentration in the reticle-stage chamber 14 reaches 1%, or when an inert gas constitutes 99% of the entire gas volume within the chamber.

If the output data from the oxygen concentration sensor 14a is monitored by the monitor 62 while the exposure apparatus is operating, it can be seen whether or not the inside of the reticle-stage chamber 14 is purged with the inert gas. If any abnormality is detected, the control section 60 may set off an alarm or take any action, such as stopping the operation of the apparatus.

Figure 3:
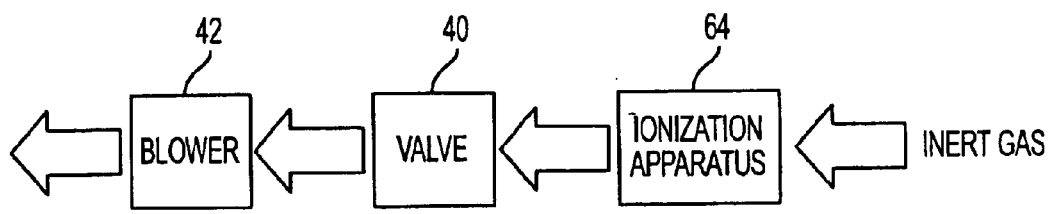
FIG. 3 is a descriptive diagram illustrating a major section of a modification of the first embodiment of FIG. 1.

In general, it is preferable that the gas supplied to the reticle-stage chamber 14 is pure. However, there is a risk in that the DUV light may irradiate the reticle 10 to cause a photoelectric effect in which the charged reticle 10 adsorbs particles or the discharge from an electrostatically charged status may destroy the reticle patterns. In order to prevent this adverse effect, an ionization apparatus 64, as shown in FIG. 3, may be arranged where gas flows into the apparatus, as illustrated in FIG. 1, such that a part of the gas is ionized before entering. The ionization apparatus 64, for example, may be arranged before the valve 40, as illustrated in FIG. 3. Spreading an anti-static chemical over the reticle also may be an effective countermeasure for preventing electrostatic damage.

Figure 4:
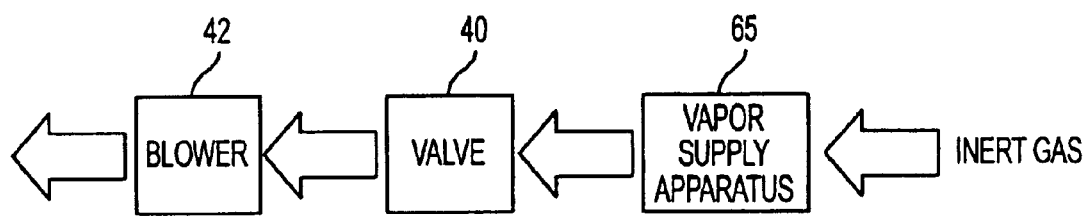
FIG. 4 is a descriptive diagram illustrating a major section of an alternate modification of the first embodiment of FIG. 1.

Mixing steam with a gas is also an effective countermeasure for preventing electrostatic damage. For example, as illustrated in FIG. 4, a steam-supply apparatus 65 may be arranged before the valve 40 for mixing steam with an inert gas supplied from the external gas-supply source 82.

Figure 5:
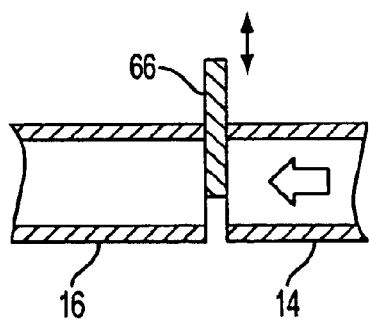
FIG. 5 is a descriptive diagram illustrating a major section of a further alternate modification of the first embodiment of FIG. 1.

In the apparatus illustrated in FIG. 1, an opening between the reticle-stage chamber 14 and the reticle-transfer chamber 16 can be configured such that the opening closes when a reticle 10 is not going through. For example, as illustrated in FIG. 5, a slidable shutter member 66 may be arranged between the reticle-stage chamber 14 and the reticle-transfer chamber 16 so that the control section 60 drives and opens the shutter member 66 only when a reticle 10 is transferred through the reticle-transfer chamber 16, putting the two chambers in the open status. This configuration reduces the required volume of inert gas, thus reducing gas consumption.

Since the exhaust system 30 is formed in the reticle-transfer chamber 16, the shutter 66 opens when purging the air-gas mixture in reticle-stage chamber 14 with a new gas. Note that the opening/closing mechanism of the shutter 66 is not limited to the type of shutter illustrated in FIG. 5, but any suitable shape or any method may be used to open/close the two chambers.

In the aforementioned projector-exposure apparatus, the exposed DUV light will also impinge on the reticle stage 12 or other structural objects in chamber 14. When there is a danger in generating a gas impurity due to a photochemical reaction with the surfaces of these structural objects, it is preferable that a chemical filter is inserted before the ULPA filter 50 to remove the gas impurity (e.g., ionic ammonium gas).

Figure 6:
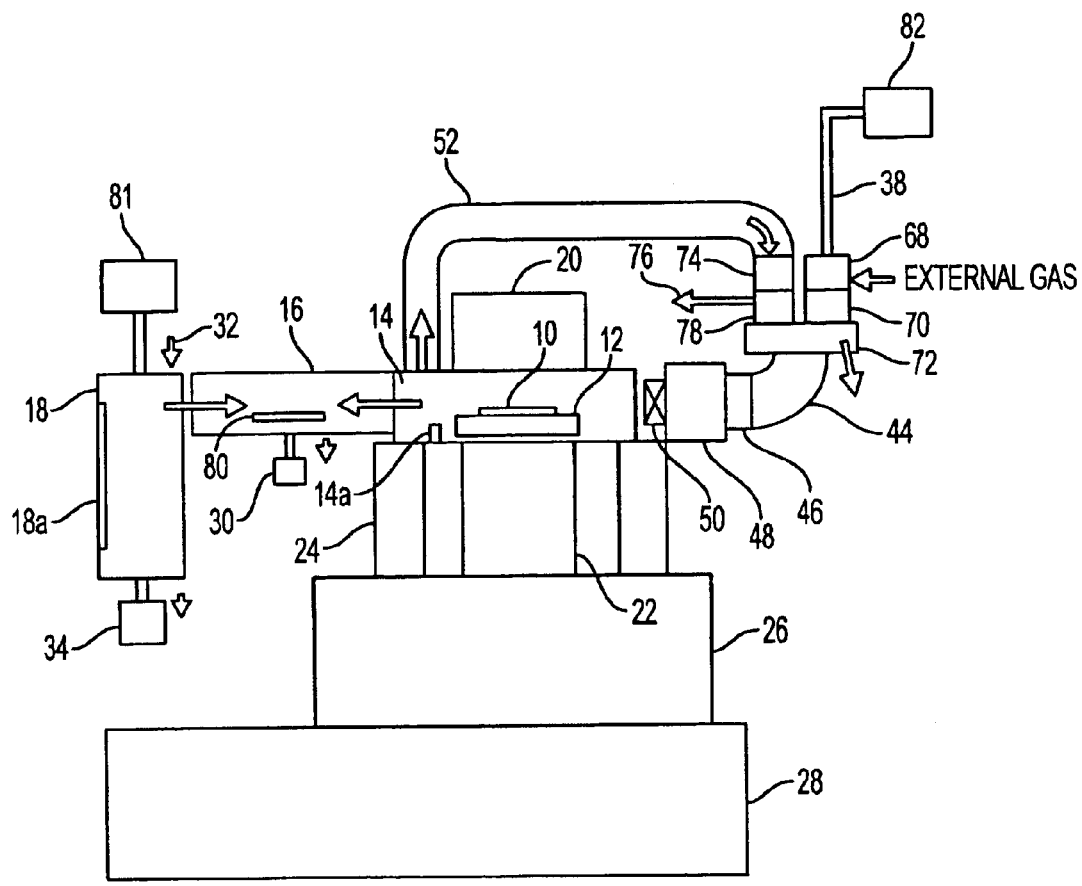
FIG. 6 is a schematic configuration of a projector-exposure apparatus according to a second embodiment of the present invention.

FIG. 6 illustrates a projector-exposure apparatus in accordance with a the second embodiment of this invention. In this embodiment, the elements which are the same as or correspond to those of the first embodiment are given the same identifying numerals and any redundant descriptions are eliminated. This apparatus has basically the same configuration as the first embodiment except for the configuration of the inert gas circulation system. That is, this configuration uses a valve 68 in the passage for switching the gas from the external plumbing 38 and air from outside the apparatus. The gas coming through the valve 68 is supplied to the mixing portion with the assistance of a blower 70. Also, the gas returned through the return duct 52 is supplied to a selection portion 78 with the assistance of another blower 74. The selection portion 78 selects the passage for switching between the mixing portion 72 and an exhaust system 76 which leads to outside the apparatus.

In this embodiment, when purging the inside of the reticle-stage chamber 14 with the air-high purity inert gas mixture, the gas from the selection portion 78 is pumped out through the exhaust system 76. However, after the gas within the reticle-stage chamber 14 reaches a specified purity (concentration), it returns through the selection portion 78 to the mixing portion 72. On the other hand, when taking air into the reticle-stage chamber 14, the valve 68 is closed with respect to the external plumbing 38, as is done in the aforementioned first embodiment. The valve 68 is opened with respect to the outside of the apparatus such that the external air can be taken in as marked with an arrow. In addition, the monitor 62 (FIG. 2) monitors the output data from the oxygen concentration sensor 14a, based on which the control system 60 controls the selection portion 78.

Note that the manner in which the first embodiment was modified, as illustrated in FIGS. 3, 4, and 5, is also applicable to the second embodiment. That is, the ionization apparatus 64 (FIG. 3) may be arranged before the valve 68. One of the specific examples of the ionization apparatus 64 is the one which uses the ionization of inert gas using soft X-rays. An anti-static agent may be spread over the reticle. In addition, the steam-supply apparatus 65 (FIG. 4) may be arranged before the valve 68 to mix the inert gas supplied from the external plumbing 38 with steam.

As such, embodiments of this invention have been described. The scope of this invention is not limited to these embodiments and these embodiments can be modified without departing from the scope of the invention as defined by the claims. For example, this invention may be applied to a wafer system (not illustrated) rather than a reticle system.

What is claimed is:

1. An environmental-control method for controlling a gas concentration within a chamber comprising:
   supplying a predetermined gas into said chamber which includes air therein;
   monitoring the predetermined gas concentration within said chamber;
   exhausting a portion of an air-gas mixture in said chamber until said predetermined gas concentration in said chamber reaches a predetermined value; and
   circulating a portion of the air-gas mixture in said chamber after said predetermined gas concentration in said chamber reaches said predetermined value.

2. A method, as claimed in claim 1, wherein said chamber is a mask stage chamber filled with said predetermined gas.

3. A method, as claimed in claim 1, wherein said chamber is a wafer stage chamber filled with said predetermined gas.

4. An environmental-control apparatus for controlling a gas concentration within a chamber comprising:
   a supply device connected to said chamber which includes air therein, said supply device supplying a predetermined gas into said chamber;
   a sensor which detects the predetermined gas concentration within said chamber; and
   a circulator connected to said chamber, said circulator exhausting a portion of an air-gas mixture in said chamber until said predetermined gas concentration in said chamber reaches a predetermined value and circulating said portion of the air-gas mixture in said chamber after said predetermined gas concentration in said chamber reaches said predetermined value.

5. An apparatus according to claim 4, further comprising:
   a mixer, connected to said supply device, to mix the gas within said chamber with said predetermined gas.

6. An apparatus according to claim 5, wherein said sensor is disposed in said chamber.

7. An apparatus according to claim 6, wherein said chamber is a mask-stage chamber.

8. An apparatus according to claim 6, wherein said chamber is a wafer stage chamber.

9. An apparatus according to claim 4, further comprising:
   an ionizer, disposed in a path of said predetermined gas supplied from said supply device, to ionize at least a part of said predetermined gas supplied from said supply device to said chamber.

10. An apparatus according to claim 4, wherein said circulation-controller comprises:
    a duct having one end communicating with said chamber and another end communicating with said gas-supply device, to guide the gas mixture within said mask chamber to said gas-supply device;
    a mixer connected to said duct and said gas-supply device, to mix said gas mixture supplied through said duct with said specified gas from said gas-supply device when desired; and
    a passage-controller connected to said mixer, to guide said gas mixture supplied via said duct to said mixer when said specified gas within said chamber reaches said predetermined concentration.

11. An environmental-control apparatus for an exposure apparatus that forms an image of a pattern on a predetermined surface by exposure light beam, comprising:
    an illumination unit disposed on an optical path of the exposure light beam to illuminate a mask having said pattern;
    a projection unit disposed on the exposure light beam to form the image of the pattern on the predetermined surface;
    a mask chamber disposed between the illumination unit and the projection unit to surround a space that includes the mask;
    a gas-supply device connected to said mask chamber to supply a specified gas into said mask chamber;
    an exhaust device connected to said mask chamber to exhaust a gas mixture which includes said specified gas within said mask chamber;
    a detector which detects the concentration of said specified gas within said mask chamber; and
    a circulation-controller connected to said detector, said circulation-controller circulating a part of the gas mixture which includes said specified gas in said mask chamber when said specified gas within said mask chamber reaches a predetermined concentration.

12. An environmental-control apparatus, according to claim 11, comprising:
    a mask-storage, spaced from an optical path of said light, to store masks to be exchanged with the mask positioned in said mask chamber; and
    a mask-transfer chamber arranged between said mask-storage and said mask chamber.

13. An environmental-control apparatus, according to claim 12, wherein said circulation-controller comprises:
- a duct having one end communicating with said mask chamber and another end communicating with said gas-supply device, to guide the gas mixture within said mask chamber to said gas-supply device;
- a mixer connected to said duct and said gas-supply device, to mix said gas mixture supplied through said duct with said specified gas from said gas-supply device when desired; and
- a passage-controller connected to said mixer, to guide said gas mixture supplied via said duct to said mixer when said specified gas within said mask chamber reaches said predetermined concentration.

14. An environmental-control apparatus, according to claim 12, which also comprises an ionizer, disposed in a path of said specified gas supplied from said gas-supply device, to ionize at least a part of said specified gas supplied from said gas-supply device to said mask chamber.

15. An environmental-control apparatus, according to claim 11, which further comprises a steam-supply device, disposed in a path of said specified gas supplied from said gas-supply device, to mix steam with said specified gas supplied from said gas-supply device to said mask chamber.

16. An environmental-control apparatus, according to claim 12, which further comprises a steam-supply device, disposed in a path of said specified gas supplied from said gas-supply device, to mix steam with said specified gas supplied from said gas-supply device to said mask chamber.

17. An environmental-control apparatus, according to claim 12, which comprises a sealing portion, disposed between said mask chamber and said mask transfer chamber, to seal any space between said mask chamber and said mask transfer chamber when said mask is not passing between them.

18. An environmental-control apparatus for an exposure apparatus having a chamber filled with a specified gas, said chamber being adapted to have positioned therein, a substrate to be illuminated by light, said environmental-control apparatus comprising:
- a gas-supply device connected to said chamber to supply a specified gas into said chamber;
- an exhaust device connected to said chamber to exhaust a gas mixture which includes said specified gas within said chamber;
- a detector which detects the concentration of said specified gas within said chamber;
- a circulation-controller connected to said detector, said circulation-controller circulating a part of the gas mixture which includes said specified gas in said chamber when said specified gas within said chamber reaches a predetermined concentration;
- a storage, spaced from an optical path of said light, to store substrates to be exchanged with the substrate positioned in said chamber;
- a transfer chamber arranged between said storage and said chamber; and
- a pressure-controller connected to at least one of said storage, said transfer chamber, and said chamber, to set parameters to satisfy the following equations and $$A \geq B > C$$
$$A \geq B > D$$

wherein A is the pressure within said chamber; B is the pressure within said storage; C is the pressure within said transfer chamber; and D is the pressure outside the apparatus.

19. An environmental control apparatus, according to claim 18, wherein said circulation-controller comprises:
- a duct having one end communicating with said chamber and another end communicating with said gas-supply device, to guide the gas within said chamber to said gas-supply device;
- a mixer, connected to said duct and said gas-supply device, to mix said gas mixture supplied through said specified duct with said gas from said gas-supply device when desired; and
- a passage-controller connected to said mixer, to guide said gas mixture supplied via said duct to said mixer when said specified gas within said chamber reaches said predetermined concentration.

20. An environmental-control apparatus, according to claim 18, wherein said substrate is a wafer or mask having a pattern.

21. An environmental-control apparatus for an exposure apparatus having a chamber filled with a specified gas, said chamber being adapted to have positioned therein, a substrate to be illuminated by light, said environmental-control apparatus comprising:
- a gas-supply device connected to said chamber to supply a specified gas into said chamber;
- an exhaust device connected to said chamber to exhaust a gas mixture which includes said specified gas within said chamber;
- a detector which detects the concentration of said specified gas within said chamber; and
- a circulation-controller connected to said detector, said circulation-controller circulating a part of the gas mixture which includes said specified gas in said chamber when said specified gas within said chamber reaches a predetermined concentration, wherein said circulation-controller comprises
- a duct having one end communicating with said chamber and another end communicating with said gas-supply device, to guide the gas mixture within said chamber to said gas-supply device,
- a mixer, connected to said duct and said gas-supply device, to mix said gas mixture within said chamber supplied through said duct with said gas from said gas-supply device when desired, and
- a passage-controller connected to said mixer, to guide said gas mixture supplied via said duct to said mixer when said specified gas within said chamber reaches said predetermined concentration.

22. An environmental-control apparatus, according to claim 21,
wherein said mixer also acts as a blower to assist the supply of gas to said chamber.

23. An environmental-control apparatus, according to claim 21, comprising a first blower, connected to said mixer, to assist the supply of said gas to said mixer and wherein said passage-controller includes a second blower connected to said duct, and a selection member connected to said second blower, to selectively supply said gas from said second blower to said mixer.

24. An environmental-control apparatus for an exposure apparatus having a chamber filled with a specified gas, said chamber being adapted to have positioned therein, a substrate to be illuminated by light, said environmental-control apparatus comprising:
- a gas-supply device connected to said chamber to supply a specified gas into said chamber;
- an exhaust device connected to said chamber to exhaust a gas mixture which includes said specified gas within said chamber;

a detector which detects the concentration of said specified gas within said chamber;

a circulation-controller connected to said detector, said circulation-controller circulating a part of the gas mixture which includes said specified gas in said chamber when said specified gas within said chamber reaches a predetermined concentration; and an ionizer, disposed in a path of said specified gas supplied from said gas-supply device, to ionize at least a part of said specified gas supplied from said gas-supply device to said chamber.

25. An exposure method for illuminating a mask having a pattern with an exposure light beam from an illumination unit and forming an image of the pattern on a predetermined surface through a projection unit, comprising:

exhausting a gas mixture in a chamber disposed between the illumination unit and the projection unit before exposure is started while supplying a selected gas to said chamber;

monitoring the selected gas concentration within said chamber; and circulating a part of the gas mixture which includes the selected gas in said chamber when said selected gas concentration in said chamber reaches a predetermined concentration.

26. An exposure method according to claim 25, wherein said gas mixture within said chamber includes air.

27. An exposure method according to claim 25 further comprising:

said gas mixture in said chamber exhausts said gas mixture from said chamber until said predetermined gas concentration in said chamber reaches a predetermined gas concentration.

28. An exposure method according to claim 25, wherein said exposure process is stopped based on said detection result of a gas concentration.

29. An exposure method according to claim 25, wherein said chamber is a mask-stage chamber.

30. An exposure apparatus for forming an image of a pattern on a predetermined surface by exposure light beam, comprising:

an illumination unit disposed on an optical path of the exposure light beam to illuminate a mask having said pattern;

a projection unit disposed on an optical path of the exposure light beam to form the image of the pattern on the predetermined surface;

a mask chamber disposed between the illumination unit and the projection unit to surround a space that includes the mask;

a gas-supply device, connected to said mask chamber, to supply a specified gas into said mask chamber;

an exhaust device, connected to said mask chamber, to exhaust part of a gas mixture which includes said specified gas within said mask chamber;

a detector that detects the concentration of said specified gas within said mask chamber; and a circulation-controller, connected to said detector and said mask chamber, to circulate a part of said gas mixture in said mask chamber when said specified gas within said mask chamber reaches a predetermined concentration.

31. An exposure apparatus according to claim 30, further comprising:

a mixer, connected to said gas supply device, to mix the gas within said mask chamber with said specified gas.

32. An exposure apparatus according to claim 30, wherein said exhaust device exhausts the gas mixture within said chamber until said specified gas concentration in said mask chamber reaches said predetermined concentration.

33. An exposure apparatus according to claim 30, further comprising a controller, connected to said sensor, to stop a light beam exposure based on a detection result of a gas concentration.

34. An exposure apparatus according to claim 30, wherein said detector is disposed in said mask chamber.

35. An exposure apparatus according to claim 30, comprising:

a mask-storage, spaced from an optical path of said light, to store masks to be exchanged with the mask positioned in said mask chamber; and a mask-transfer chamber arranged between said mask-storage and said mask chamber.

36. An exposure apparatus according to claim 35, including a pressure-controller connected to at least one of said mask-storage, said mask-transfer, and said mask chamber, to set parameters to satisfy the following equations and:

$$A \geq B > C$$

$$A \geq B > D$$

where A is the pressure within said mask chamber; B is the pressure within said mask-storage; C is the pressure within said mask-transfer chamber; and D is the pressure outside the apparatus.

37. An exposure apparatus having a chamber filled with a specified gas, said chamber being adapted to have positioned therein a substrate, comprising:

a storage spaced from said optical path of said light to store a substrate to be exchanged with the substrate within said chamber;

a transfer chamber, positioned between said chamber and said storage forming a transfer space through which said substrate is transferred between said chamber and storage; and a controller connected to at least one of said chamber, said storage, and said transfer chamber, to control a condition such that $A \geq B > D$, where
A=pressure in said chamber;
B=pressure in said storage; and
D=pressure outside said apparatus.

38. An exposure apparatus according to claim 37, wherein said controller controls a condition such that $A \geq B > C$, where
A=pressure in said chamber;
B=pressure in said storage; and
C=pressure in said transfer chamber.

39. An exposure apparatus, according to claim 37, further comprising:

an illumination unit disposed on an optical path of the exposure light beam to illuminate a mask having a pattern; and a projection unit disposed on the optical path of the exposure light beam to form the image of the pattern on a predetermined surface, wherein said chamber disposed between said illumination unit and said projection unit.

40. An exposure apparatus, according to claim 37, wherein said substrate is a wafer or a mask having a pattern.

41. An exposure apparatus having a chamber filled with a specified gas, said chamber being adapted to have positioned therein a substrate, comprising:

a storage spaced from said optical path of said light to store a substrate to be exchanged with the substrate within said chamber;

a transfer chamber positioned between said chamber and said storage forming a transfer space through which said substrate is transferred between said chamber and storage; and a controller connected to at least one of said chamber, said storage, and said transfer chamber, to control a condition such that A≧B>C, where
A=pressure in said chamber;
B=pressure in said storage; and
C=pressure in said transfer chamber.

42. An exposure apparatus according to claim 41, wherein said controller controls a condition such that A≧B>D, where
A=pressure in said chamber;
B=pressure in said storage; and
D=pressure outside said apparatus.

43. An exposure apparatus, according to claim 41, further comprising:

an illumination unit disposed on an optical path of the exposure light beam to illuminate a mask having a pattern; and a projection unit disposed on the optical path of the exposure light beam to form the image of the pattern on a predetermined surface, wherein said chamber disposed between said illumination unit and said projection unit.

44. An exposure apparatus, according to claim 41, wherein said substrate is a wafer or a mask having a pattern.

45. An exposure method for illuminating a substrate with an exposure light beam, comprising:

surrounding a space that includes a substrate with a chamber;

transferring the substrate within a transfer chamber;

storing a substrate to be exchanged with the substrate within the chamber;

wherein said transfer chamber is positioned between said chamber and the storage which stored that substrate to be exchanged with the substrate within the chamber, and which forms a transfer space through which said substrate is transferred between said chamber and said storage, and establishing a condition such that A≧B>D, where
A=pressure in said chamber;
B=pressure in said storage; and
D=pressure outside said chamber, said storage, and said transfer chamber.

46. An exposure method according to claim 45, wherein the following condition is established:

A≧B>C, where:
A=pressure in said chamber;
B=pressure in said storage; and
C=pressure in said transfer chamber.

47. An exposure method for illuminating a substrate with an exposure light beam, comprising:

surrounding a space which includes a substrate with a chamber;

transferring the substrate within a transfer chamber;

storing a substrate to be exchanged with the substrate within the chamber;

wherein said transfer chamber is positioned between said chamber and the storage which stored the substrate to be exchanged with the substrate within the chamber, and which forms a transfer space through which said substrate is transferred between said chamber and said storage, and establishing a condition such that A≧B>C, where
A=pressure in said chamber;
B=pressure in said storage; and
C=pressure in said transfer chamber.

48. An exposure method according to claim 47, wherein the following condition is established:

A≧B>D, where:
A=pressure in said chamber;
B=pressure in said storage; and
D=pressure outside said chamber, said storage, and said transfer chamber.

49. A method for making an exposure apparatus having a chamber filled with a specified gas, said chamber being adapted to have positioned therein a substrate, comprising:

positioning said chamber in an optical path of an exposure light beam;

positioning a storage storing substrate to be exchanged with the substrate within said chamber, at a position spaced from said chamber;

positioning a transfer chamber, which forms a transfer space through which said substrate is transferred between said chamber and said storage, between said chamber and said storage; and establishing a condition such that A≧B>D, where
A=pressure in said chamber;
B=pressure in said storage; and
D=pressure outside said apparatus, by a control device connected to at least one of said chamber, said storage and said transfer chamber.

50. A method for making an exposure apparatus having a chamber filled with a specified gas, said chamber being adapted to have positioned therein a substrate, comprising:

positioning said chamber in an optical path of an exposure light beam;

positioning a storage storing substrate to be exchanged with the substrate within said chamber, at a position spaced from said chamber;

positioning a transfer chamber, which forms a transfer space through which said substrate is transferred between said chamber and said storage, between said chamber and said storage; and establishing a condition such that A≧B>C, where
A=pressure in said chamber;
B=pressure in said storage; and
C=pressure in said mask transfer chamber, by a control device connected to at least one of said chamber, said storage and said transfer chamber.

* * * * *